United States Patent [19]

Nandi et al.

[11] 3,855,548

[45] Dec. 17, 1974

[54] ULTRA HIGH FREQUENCY SINGLE MODE OSCILLATION CONTROLLED BY A SURFACE ACOUSTIC WAVE CRYSTAL

[75] Inventors: Arabinda K. Nandi, Anaheim; Sam T. Costanza, Santa Ana; Charles E. Wheatley, III, Newport Beach, all of Calif.

[73] Assignee: Rockwell International Corporation, El Segundo, Calif.

[22] Filed: Oct. 18, 1973

[21] Appl. No.: 407,695

[52] U.S. Cl................ 331/107 A, 310/9.8, 331/135, 331/155, 333/30 R, 333/72

[51] Int. Cl............................................. H03b 5/32

[58] Field of Search................ 331/107 A, 135, 155; 333/30 R, 72; 330/5.5; 310/9.8

[56] References Cited

UNITED STATES PATENTS

| | | | |
|---|---|---|---|
| 3,568,102 | 3/1971 | Tseng | 331/107 A X |
| 3,582,540 | 6/1971 | Adler et al. | 331/107 A X |
| 3,736,587 | 5/1973 | Bush et al. | 333/72 X |
| 3,766,496 | 10/1973 | Whitehouse | 331/107 A |

OTHER PUBLICATIONS

Carr, IEEE Transactions on Microwave Theory and Techniques, Vol. MTT-17, No. 11, November 1969, pp. 845, 846.

*Primary Examiner*—Siegfried H. Grimm
*Attorney, Agent, or Firm*—Robert Ochis; G. Donald Weber, Jr.; H. Fredrick Hamann

[57] ABSTRACT

An ultra high frequency crystal oscillator includes an amplifier and a surface acoustic wave device connected in a feedback path around the amplifier. The surface acoustic wave device is the primary frequency control component of the oscillator and comprises a piezoelectric material having input and output transducers disposed thereon. Each of the transducers comprises an interdigitated electrode structure in which the separation between adjacent electrodes is a predetermined function of the acoustic wave length of a signal having a desired oscillation frequency. One of the transducers is comprised of a plurality of taps the spacing of which is a predetermined function of the length of the other transducer.

In addition to the surface acoustic wave device, the feedback path of the amplifier may include, inter alia, power splitters, reactance compensating networks and a phase adjusting network for making small adjustments in the frequency of oscillation of the oscillator.

7 Claims, 6 Drawing Figures

ULTRA HIGH FREQUENCY SINGLE MODE OSCILLATION CONTROLLED BY A SURFACE ACOUSTIC WAVE CRYSTAL

BACKGROUND OF THE INVENTION

1. Field of the Invention

The invention relates to the field of crystal controlled oscillators and more particularly to the field of ultra high frequency crystal controlled oscillators.

2. Prior Art

Fundamental mode crystal controlled oscillators have been successfully achieved at frequencies up to about 30 MHz. In these oscillators the frequency of oscillation is controlled by acoustic waves within the bulk of a piezoelectric crystal. Through the use of overtone modes, such oscillators have been successful in producing crystal controlled oscillation up to about 150 MHz using a fifth overtone mode. Unfortunately, due to size limitations on the crystal, direct generation of higher frequencies from crystal controlled oscillators wherein the bulk of the crystal transmits the vibrations does not appear feasible. The use of higher overtone modes reduces the desired benefits from crystal control of low noise, narrow bandwidth, single-frequency output signals, since the overtone tuning widens the bandwidth and permits more noise in the oscillator loop. Despite the difficulty of obtaining high frequency signals from crystal oscillators, there is a great need in the 100 MHz to 1 GHz and higher frequency range for signals having the characteristics which are associated with crystal control, that is a well-defined single frequency output with a low background noise spectrum.

SUMMARY OF THE INVENTION

A single mode crystal controlled oscillation up to about 1 GHz has been achieved through the use of a tapped surface acoustic wave delay line in a feedback configuration. For this application, the delay line preferably comprises an ST-cut quartz substrate; however other piezoelectric materials may be employed. The ST-cut quartz is preferred because the propagation time delay between two points on the crystal surface is nearly temperature independent.

Input and output transducers are disposed on the exposed surface of the piezoelectric material. The input transducer preferably comprises an interdigitated electrode structure comprised of alternate first and second electrodes. Each first electrode is connected to a first connecting conductor and each second electrode is connected to a second connecting conductor.

An output transducer is suitably spaced from the input transducer in a direction to intercept surface acoustic waves generated by the input transducer. The output transducer is comprised of a series of interdigitated electrodes not unlike the input transducer in general. However, the output transducer is divided into a series of "taps" by periodic gaps between groups of the interdigitated electrodes. Each group of interdigitated electrodes constitutes a tap. The gaps or spaces between groups or taps are, generally, larger than the spaces between electrodes. By properly controlling the spacing between the interdigitated electrodes forming the taps, as well as the spacing between the taps, an oscillator which will produce a single mode oscillation having a narrow bandwidth and low background noise is achieved.

The input and output transducers are preferably placed at opposite ends of the crystal and properly oriented with respect to the axis of the crystal. The input transducer induces a surface acoustic wave on the piezoelectric material which corresponds to the electrical input signal. The output transducer, disposed transversely to the direction of motion of the surface acoustic waves, converts the surface acoustic wave on the piezoelectric material into an electrical output signal. In the process, the output transducer provides a large portion of the filtering necessary to produce the narrow bandwidth output signal of the oscillator.

Adjacent first electrodes within either transducer are typically spaced apart, center-to-center, by a distance equal to the acoustic wave length of a signal having the desired oscillation frequency. Adjacent second electrodes are also typically spaced apart by the same wave length. Thus, adjacent first and second electrodes are spaced, center-to-center, by a distance substantially equal to one half the wave length. The center-to-center spacing between adjacent taps of the output transducer is made equal to the length of the input transducer which is an integral multiple of the acoustic wave length of the signal having the desired oscillation frequency. The spacing between the center of the input transducer and the center of the output transducer is selected to provide among other things almost 360° phase shift within the closed loop of the oscillator. However, this spacing also helps to determine the separation between adjacent modes of the oscillator. The above described tap structure in the output transducer produces nulls in the frequency response of this surface acoustic wave delay line. These nulls are separated by one major and many minor lobes. The desired oscillation occurs somewhere near the peak of the main lobe, whereas other potential oscillation frequencies are in the region of the nulls.

An oscillator in accordance with this invention is operative to much higher frequencies than normal crystal controlled oscillators. The thickness of the substrate (as long as it is at least several wave lengths thick) does not influence the oscillation frequency. Rather, the oscillation frequency is determined by the construction of the various electrode structures and their disposition along the piezoelectric substrate. Frequency selectivity mainly comes from a large number of equally spaced, coherently connected taps in the output transducer of the delay line in the feedback path.

DETAILED DESCRIPTION OF A PREFERRED EMBODIMENT

Figures 1, 2, 3, 4:
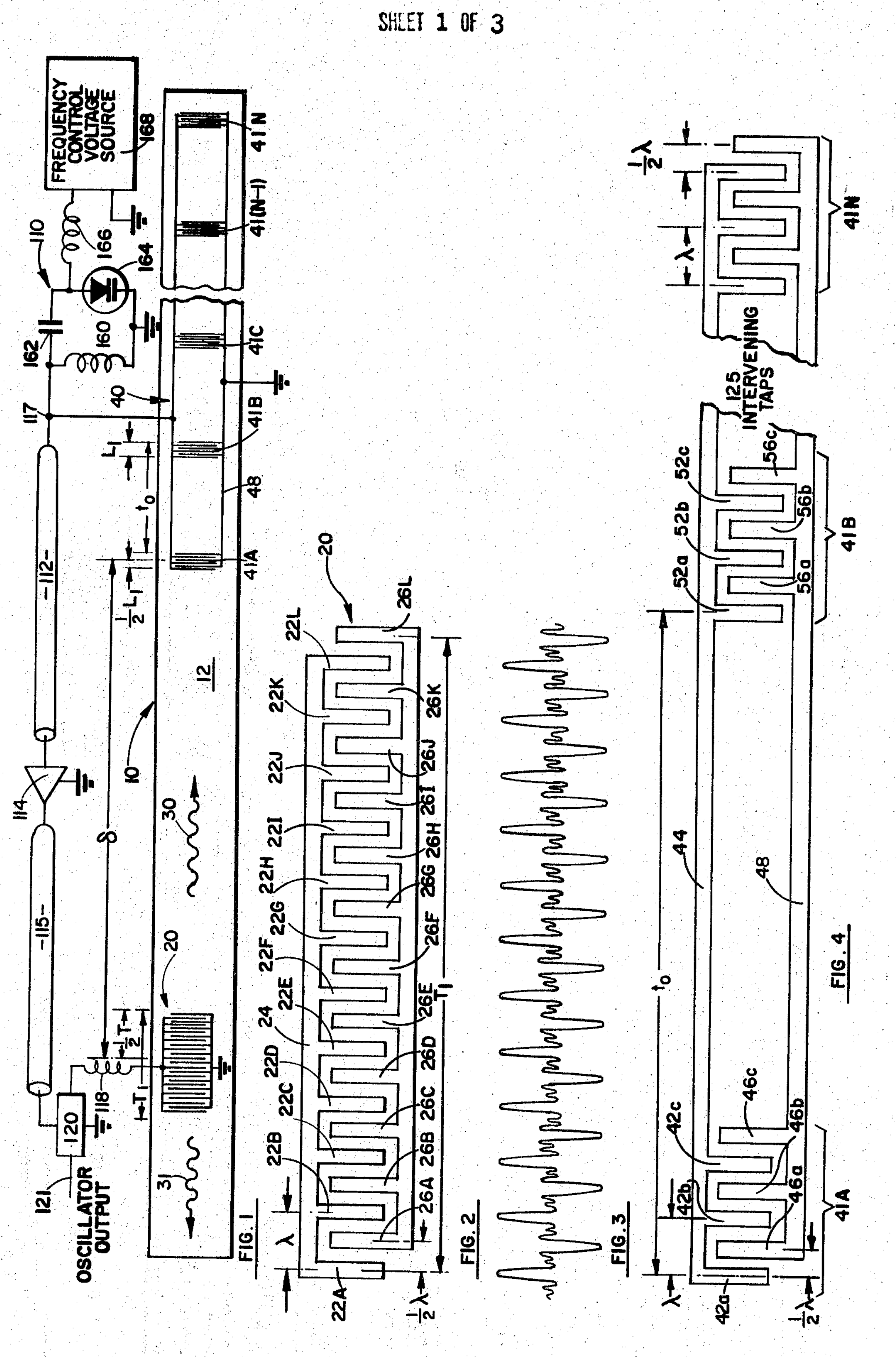
FIG. 1 illustrates the general configuration of the filter of the preferred embodiment of the invention.
FIG. 2 is a detailed illustration of the internal structure of the input transducer.
FIG. 3 is an idealized illustration of the impulse response of the input transducer.
FIG. 4 is a detailed illustration of the internal structure of part of the output transducer.

A preferred embodiment of the oscillator of this invention is illustrated in FIG. 1. The oscillator comprises a feedback filter indicated generally at 10, a phase adjustment network 110 connected to an output transducer 40 of the filter, a feedback amplifier 114 having the input terminal thereof connected to the output transducer 40 through a coaxial cable 112 and having the output terminal thereof connected through a coaxial cable 115 to a capacitance compensating network 118 connected to an input transducer 20 of the filter.

Network 118 which may be an inductor, is selected to compensate for the inherent static capacitance of the input transducer 20. If desired, a power splitter 120 may be connected into the oscillator loop to provide an isolated output terminal 121 for the oscillator. In the embodiment shown in FIG. 1, power splitter 120 is connected in series between cable 115 and compensating network 118. Input transistor 20 and output transducer 40 are preferably disposed on the surface of an ST-cut quartz, piezoelectric crystal 12 upon which a surface acoustic wave propagates when the oscillator is operating. The complete transfer function provided by the transducers in the quartz material results in a selective frequency filter 10. Although it is preferred to use an ST-cut quartz crystal 12 because it produces a minimal delay time change with temperature, other materials which will propagate a surface acoustic wave so as to yield a usable output signal may be employed. The input transducer shown generally at 20, is disposed in driving relation to material 12, whereby when transducer 20 is electrically excited a surface acoustic wave is generated on material 12. With proper selection of crystal axes, the group and phase velocities of the surface acoustic wave are co-linear and the wave propagates in a direction perpendicular to the wavefront. The resulting surface acoustic wave propagates in the directions indicated indicated by arrows 30 and 31. However, the component traveling in the direction of arrow 31 is absorbed at the end of crystal 12 and does not play any role in the operation of the oscillator.

An output transducer shown generally at 40 is disposed on material 12 where it will intercept surface acoustic waves propagating along material 12 in direction 30 as a result of electrical excitation of input transducer 20. The surface acoustic wave passing under output transducer 40 generates an electrical output signal in transducer 40. This signal constitutes the output of the primary frequency selective element 10 in the feedback path of the oscillator and is supplied to the amplifier's input cable 112 at node 117.

Input transducer 20 is shown in greater detail in FIG. 2 where its internal structure is illustrated. The transducer is comprised of a plurality of parallel interdigitated electrodes. These interdigitated electrodes are divided into first and second sets with members of the sets alternating along the transducer. Electrodes of the first set are identified by the numerals 22A through 22L and are all connected to a first connecting conductor 24. Electrodes of the second set are identified by the numeral 26A – 26L and are all connected to a second connecting conductor 28. For optimum oscillator operation, it is preferred that adjacent first electrodes such as 22A and 22B be separated by the surface acoustic wave length λ of a desired oscillation frequency. Similarly, it is preferred that adjacent second electrodes such as 26A and 26B be separated from each other by the same wave length λ. Throughout this description, distances and separations are to be measured center-to-center. Adjacent first and second electrodes such as 22A and 26A are preferably separated by one-half of the surface acoustic wave length (λ/2) of the desired oscillation frequency. The electrodes preferably have a width of λ/4. This choice of electrode width and spacing maximizes the input transducer's excitation efficiency at the desired oscillation frequency. However, these spacings are not exceedingly critical because the input transducer is a relatively wide bandwidth device.

Output transducer 40 is shown in greater detail in FIG. 4. Transducer 40 is comprised of a plurality of output taps indicated as 41A, 41B, through 41N. In the actual system discussed later 128 output taps are employed. As can be seen in FIG. 4, each tap has an internal structure similar to that of input transducer 20, except that it is comprised of fewer pairs of interdigitated electrodes. The output taps 41A, 41B through 41N are connected in parallel to provide a single output signal. The spacing between the taps and the electrodes within the taps of the output transducer is important in achieving the full benefits provided by this invention. The electrodes of the output taps are positioned in the manner indicated for the input transducer, that is, adjacent first electrodes are separated by one acoustic wave length, adjacent second electrodes are separated by one acoustic wave length and adjacent first and second electrodes are separated by a half wave length. Further, the distance between ajdacent taps, measured center-to-center, is an integral number of wave lengths of the desired oscillation frequency so that all of the output taps will contribute, in phase, to the outpt signal at the desired oscillation frequency. That is, the taps are preferably coherently connected to produce the desired output signal at the desired oscillation frequency. For optimum results, the preferred spacing between adjacent taps is equal to the length of the input transducer. The output taps are designed so that each extracts a small amount of energy from the surface acoustic wave, whereby the amplitude contribution to the output wave form from the first tap encountered by the surface acoustic wave is substantially the same as that from the final tap. If the taps were comprised of as many pairs of interdigitated electrodes as the input transducer, each tap would extract a correspondingly greater energy and the final taps would extract a smaller quantity of energy than the first taps. Further, the capacitance of the output transducer would be excessive.

Selecting the tap-to-tap spacing equal to the length of the input transducer has at least two major benefits. This arrangement results in (1) coherent addition of the tap output signals at the desired frequency and (2) the occurrence of nulls in the input transducer's response at the frequencies of the undesired main peaks in the output transducer's response. These benefits can be seen from the impulse response of the overall filter. If an impulse input (a high amplitude, very short time duration pulse) is applied to the input transducer 20, it induces a surface acoustic wave on material 12 which is the impulse response of the input transducer. Because of the plurality of first and second electrodes in the input transducer, the wave form of the impulse response is periodic. Such an impulse response is illustrated in idealized form in FIG. 3. The spacial period of the wave form is equal to the spacing between adjacent first electrodes and, thus, has the wave length of the desired oscillation frequency. This wave form then propagates toward output transducer 40 and arrives at transducer 40 in a time which is proportional to the distance separating the input and output transducers. The envelope of the output signal from output transducer 40 increases in amplitude as the wave passes under the electrodes of the first tap until the leading edge of the surface wave passes the last electrode in the first tap. Thereafter, although the output wave form will be oscillatory, the amplitude of its envelope will remain constant until the surface wave begins to pass the final electrode of tap 41N. The constant envelope amplitude results from a constant number of electrodes contributing to the output wave form because of the selected tap-to-tap spacing. Because of this spacing, as the trailing edge of the wave form passes the initial electrode of the first tap, the leading edge of the wave form begins passing the initial electrode of the second tap. Where the tap-to-tap and electrode-to-electrode spacings are as suggested above, the signals from the two taps add in phase and continue the constant amplitude output signal. The duration of the output signal produced by transducer 40 in response to the impulse input to transducer 20 is proportional to the number of taps in transducer 40.

Figure 5:
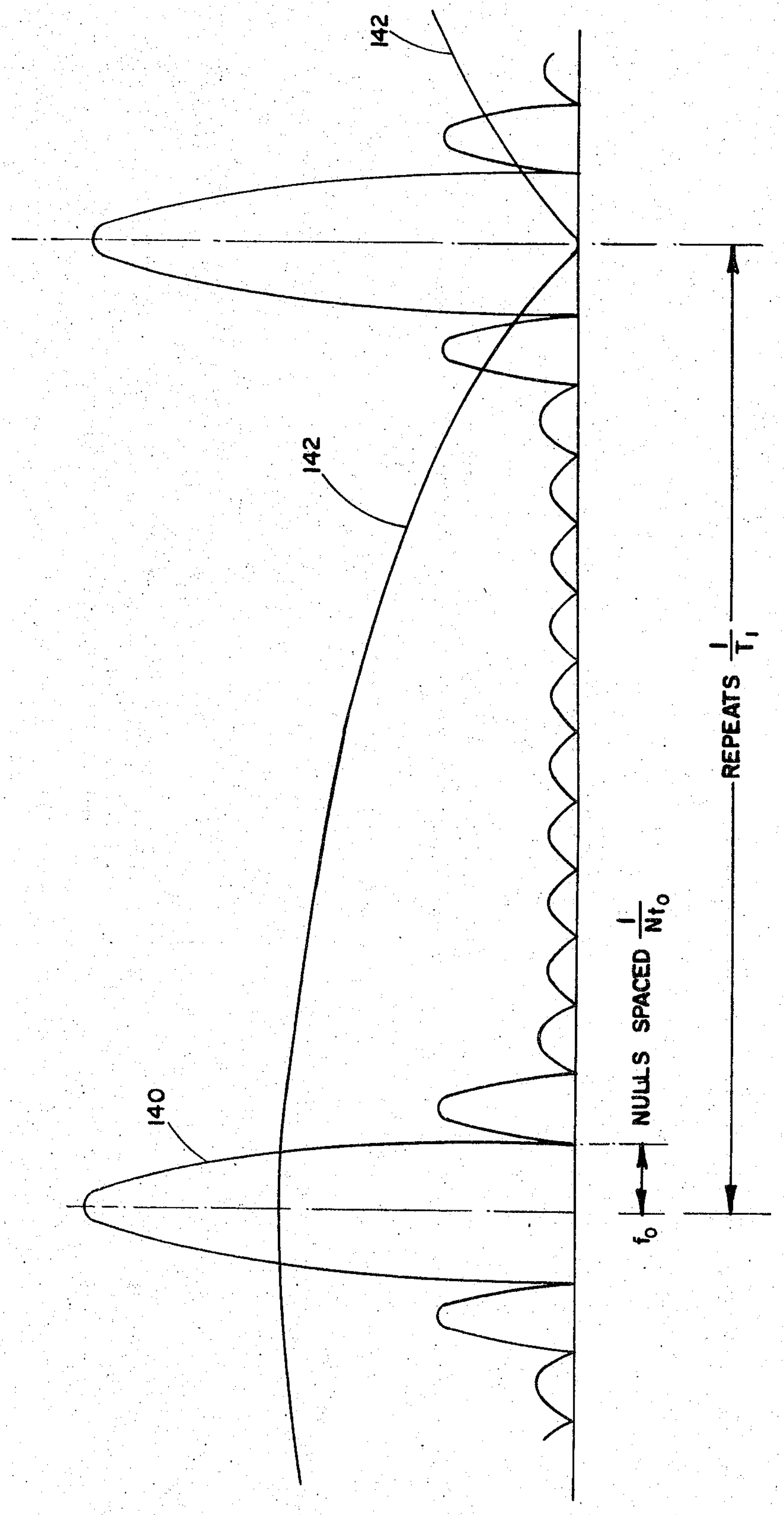
FIG. 5 illustrates partially idealized frequency responses for each transducer on the surface acoustic wave medium.

As is well known, a long duration, periodic, impulse response corresponds to a narrow bandwidth frequency response. The frequency response of the filter can be obtained either by Fourier Transforming the impulse response or by separate measurement for the frequency response. The frequency response of feedback filter output transducer 40 is illustrated in FIG. 5 as curve 140. The frequency response has a peak at the desired oscillation frequency and has nulls which are spaced therefrom by $1/Nt_o$ where $N$ is the number of taps and $t_o$ is the time separation between taps. The frequency response of output transducer 40 is periodic and has other maxima spaced from the desired oscillation at $1/t_o$ intervals.

Input transducer 20 has a frequency response illustrated by curve 142 in FIG. 5. As can be seen in the figure, input transducer 20 has a single peak frequency response which has nulls in the vicinity of the periodic maxima of curve 140 other than at the desired oscillation frequency because $t_o$ is equal to the length ($T_1$) of input transducer 20.

The overall frequency response of filter 10 at any given frequency is the product of the response of input transducer 20 at that frequency and the response of output transducer 40 at that frequency. Therefore, the overall frequency response of filter 10 has a single peak which encompasses a narrow frequency range around the desired oscillation frequency.

The actual oscillation frequency is determined by the total loop time delay. When the length of a tap $L_1$ is much less than the length of the input transducer $T_1$, i.e. $L_{1/T_1} << 1$, the separation $\Delta f$ between modes of the oscillator can be shown to be:

$$\Delta f = [1/T_1/2 + (D + \delta) + t_o/2\ (N - 1) + \Delta\phi/2\pi f_s]$$

where $N$ is the number of taps, $D$ includes external time delays of the amplifier and cables, $\delta$ is the time delay center-to-center between the input transducer and the first output tap encountered by a surface acoustic wave generated by transducer 20, $t_o$ is the time spacing center-to-center between adjacent outputs taps, $\Delta\phi$ is the phase lag introduced by phase shift network 110 and $f_s$ is the frequency of operation. These parameters are illustrated on the structures shown in FIGS. 1, 2 and 4. When the oscillator is built in accordance with the preferred embodiment $T_1 = t_o$, under usual conditions $D$ is very small compared to $\delta$ and the frequency $f_n$ of the $n^{th}$ mode is given by $$f_n = n\Delta f = n/[T_1/2 + \delta + t_o/2\ (N - 1) + \Delta\phi/2\pi f_s]$$

and, of course, can be controlled by varying $\Delta\phi$. For a 120 MHz line, $\Delta f$ can be on the order of 100 kHz for some choices of parameters. Input transducer 20 is relatively broadband around 120 MHz and could thus support many modes. The oscillator is restricted to a single mode of oscillation by the fact that the output transducer's frequency response has nulls near those frequencies other than $f_s$ at which the total phase of the oscillator loop is a multiple of 360°.

Phase adjusting network 110 may be used to vary the frequency of oscillation by changing the frequency at which the oscillator loop has a phase shift which is a multiple of 360°. If a fixed frequency oscillator is desired, network 110 may consist of a parallel connected inductor-capacitor (LC) network having one end connected to the output terminal of output transducer 40 and the other end thereof connected to ground. However, if a voltage controlled oscillator is desired, the phase adjustment network 110 contains a voltage variable element. One such circuit is shown in FIG. 1 where a fixed inductor 160 is connected in parallel with a series combination of a blocking capacitor 162 and a voltage variable capacitor 164. A frequency control voltage source 168 is connected through an inductor 166 to the node between capacitors 162 and 164. Varying the voltage of source 168 will vary the phase adjustment introduced by network 110 and, thus, the frequency of oscillation of the oscillator.

In order to design an oscillator to operate at a given frequency, the wave length λ of that frequency on the surface acoustic wave material must be determined. This wave length determines the spacing between the interdigitated electrodes of both the input transducer and the output taps, since, as discussed above, adjacent first interdigitated electrodes should be separated by one wave length of the desired frequency. Similarly adjacent second interdigitated electrodes should be separated by one wave length and adjacent first and second electrodes should be separated by one-half wave length. All spacings being measured center-to-center. The number of electrodes in the input transducer is then chosen on the basis of bandwidth considerations and the amount of electro-acoustic coupling desired. In the present instance, an input transducer with 12 pairs was chosen, thus giving a total input transducer length of 12 wavelengths. The number of electrodes in each output tap is then chosen to be small compared to the number of electrodes in the input transducer. This number is about 3 electrode pairs per tap in the preferred embodiment shown and described. The center-to-center separation between taps is then chosen to be equal to the length of the input transducer. The only remaining construction variables to be selected are the number of output taps and the spacing between the input transducer and the output transducer. The number of output taps plays a major role in determining the frequency selectivity of the feedback loop. However, it also influences the separation between modes, since the number of taps N appears in the denominator of the expression for the separation between modes. Thus higher selectivity is accompanied by decreased mode separation. The separation $\delta$ between the input and output transducers is not critical so long as phase shift network 110 can produce a 360° phase angle in the oscillator closed loop at the desired oscillation frequency. From the point of view of ease of construction of the delay line, it is preferred to have $\delta$ in the range between three and five times the length of the input transducer.

A voltage controlled oscillator built in accordance with the above description oscillated at 120 MHz. This oscillator was adjustable in frequency by up to 20 KHz. In this oscillator, the basic frequency determining parameters of feedback filter 10 had the measured values given in the following table. The component of the phase adjustment network 110 had the nominal values which are also listed in the table.

TABLE

| | | |
|---|---|---|
| $T_1$ | = | $100 \times 10^{-9}$ seconds |
| $L_1$ | = | $25 \times 10^{-9}$ seconds |
| $\delta$ | = | $375 \times 10^{-9}$ seconds |
| to | = | $100 \times 10^{-9}$ seconds |
| N | = | 128 |
| $\lvert\Delta\phi\rvert < \pi/2$ | | |
| Inductor 160 | = | 100nh |
| Capacitor 162 | = | .01mf |
| Capacitor 164 | = | MV1624 diode |
| Inductor 166 | = | 1.0mh |

Figure 6:
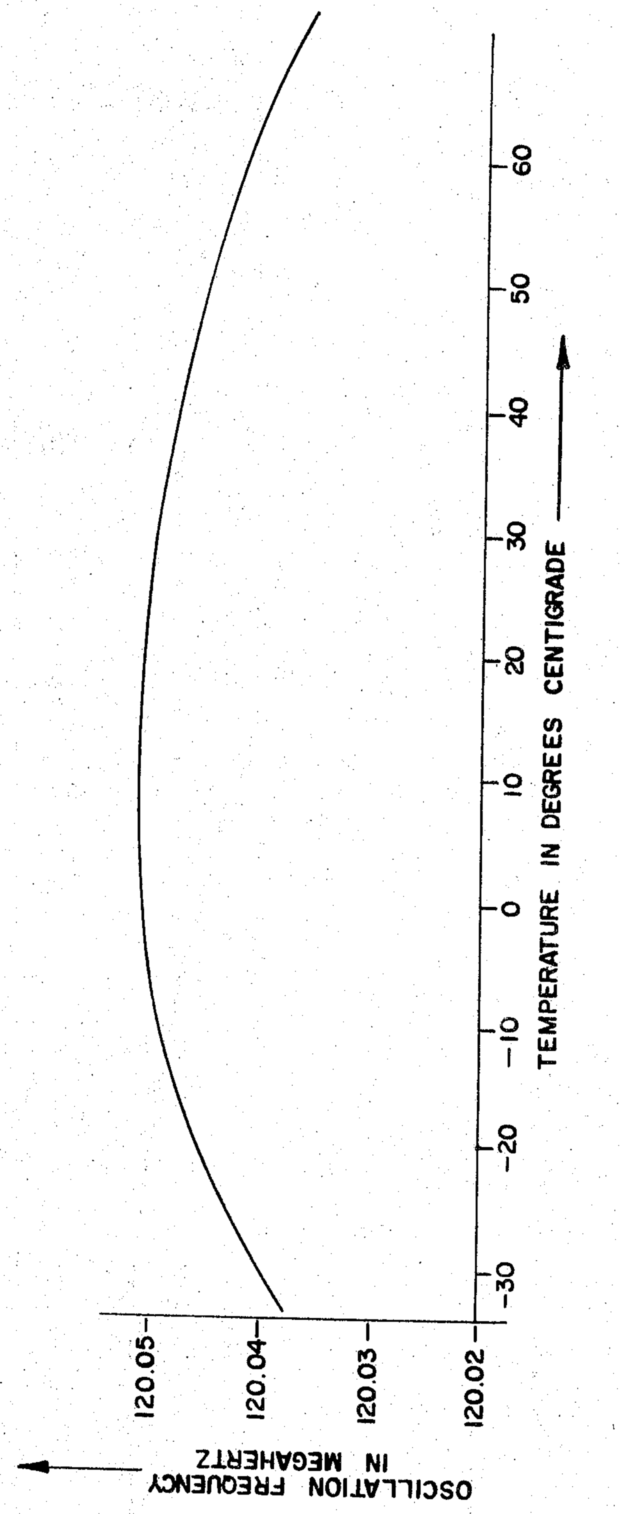
FIG. 6 illustrates the oscillators frequency variation with the temperature of the surface acoustic wave feedback filter.

This oscillator's frequency variation with temperature was measured by placing only the tapped delay line (feedback filter 10) in a temperature chamber. Over a temperature range of −20°C to +50°C the oscillator's frequency varied only 40 parts per million. The oscillation frequency vs. temperature is shown in FIG. 6.

Phase noise measurements on a pair of these surface acoustic wave oscillators phase-locked to each other showed a single side-band phase-noise-to-carrier power of about −100db in a 1 Hz bandwidth at an offset frequency of 100Hz.

As can be seen from FIG. 5 the "passband" of the feedback filter is approximately $2\Delta f$ wide. In the oscillator tested above this bandwidth was on the order of 100 KHz. With the oscillator operating at 120 MHz, this gives a circuit Q on the order of 1,200. However, as indicated by test results the effective oscillator Q appears much better than this calculation would predict, although it does not approach the Q provided by "normal" crystal oscillators, wherein value of a million are achieved. The reason for the improved results over what would be expected on a basis of traditional Q measurements is not fully understood, but is believed to result from the use of a distributed non-dispersive structure.

In a traditional filter, the time required for various frequencies to propagate through the filter is not constant. This is true, even for frequencies well within the 3db bandwidth of the filter. In contrast, in the instant frequency selective filter, all frequencies exhibit the same time delay as they propagate through the filter, and all dispersive effects are in the external circuitry which is not highly tuned. This may account for the relatively pure oscillation frequency obtained from the "low Q" filter used to control frequency within our oscillator.

The oscillator of this invention has been discussed in terms of the preferred embodiment in which the input transducer is a unitary interdigital transducer and the output transducer is a tapped interdigital transducer. However, many variations are possible, including reversing the roles of the two transducers, or placing tapped transducers at both ends of the surface acoustic wave material.

What is claimed is:

1. An oscillator comprising an amplifier having a surface acoustic wave delay line in a feedback path, wherein the delay line comprises:

a substrate capable of supporting surface acoustic waves; and first and second transducers each disposed in coupling relation to said substrate;

said first transducer comprised of a plurality of taps connected in parallel, each said tap comprising an interdigital transducer;

said taps being spaced center-to-center by an integral multiple of the wave length of a desired oscillation frequency so that each tap will produce an in-phase output signal at said desired frequency; and said second transducer comprising an interdigital transducer.

2. The oscillator of claim 1 wherein:

each interdigital transducer comprises alternate first and second electrodes wherein each first electrode of a given transducer is connected to a first connecting conductor and each second electrode of the given transducer is connected to a second connecting conductor:

the first electrodes of said taps of said first transducer are spaced from the adjacent first electrodes of the same tap by the wave length of said desired frequency;

the second electrodes of said taps of said first transducer are spaced from the adjacent second electrodes of the same tap by the wave length of said desired frequency;

adjacent first and second electrodes of the same tap of said first transducer are spaced from each other by one-half of the wave length of said desired frequency;

the first electrodes of the second transducer are spaced from the adjacent first electrodes by the wave length of the desired frequency;

the second electrodes of the second transducer are spaced from the adjacent second electrodes by the wave length of the desired frequency; and adjacent first and second electrodes of the second transducer are spaced from each other by one-half of the wave length of the desired frequency.

3. The oscillator of claim 2 wherein each electrode is substantially one-quarter wave length in width.

4. The oscillator of claim 1 wherein said second transducer has many more electrodes than any tap and is much longer than any tap.

5. The apparatus of claim 4 wherein said taps are separated by the length of said second transducer.

6. The apparatus of claim 5 wherein said first transducer is an output transducer and said second transducer is an input transducer.

7. The apparatus of claim 1 wherein the tap of said first transducer which is nearest the second transducer is spaced from the second transducer by a distance of between 3 and 5 times the length of said second transducer inclusive.

* * * * *